United States Patent
Mack et al.

(10) Patent No.: US 6,928,127 B2
(45) Date of Patent: Aug. 9, 2005

(54) FREQUENCY SYNTHESIZER WITH PRESCALER

(75) Inventors: Michael P. Mack, Sunnyvale, CA (US); Srenik Mehta, San Francisco, CA (US)

(73) Assignee: Atheros Communications, Inc., Sunnyvale, CA (US)

(*) Notice: Subject to any disclaimer, the term of this patent is extended or adjusted under 35 U.S.C. 154(b) by 70 days.

(21) Appl. No.: 10/387,231

(22) Filed: Mar. 11, 2003

(65) Prior Publication Data
US 2004/0179641 A1 Sep. 16, 2004

(51) Int. Cl.[7] ............................................... H04L 7/00
(52) U.S. Cl. ..................................................... 375/371
(58) Field of Search .............................. 375/371, 373, 375/376, 354, 374; 327/141, 151, 150, 147, 154, 160, 155, 156, 169

(56) References Cited

U.S. PATENT DOCUMENTS

| | | | | |
|---|---|---|---|---|
| 4,891,774 A | * | 1/1990 | Bradley | 708/103 |
| 5,202,906 A | * | 4/1993 | Saito et al. | 331/14 |
| 5,337,024 A | * | 8/1994 | Collins | 332/127 |
| 5,694,089 A | * | 12/1997 | Adachi et al. | 331/16 |
| 6,236,275 B1 | * | 5/2001 | Dent | 331/1 A |
| 6,236,278 B1 | * | 5/2001 | Olgaard | 331/25 |
| 6,329,850 B1 | * | 12/2001 | Mair et al. | 327/107 |
| 6,456,164 B1 | * | 9/2002 | Fan | 331/16 |
| 6,707,855 B2 | * | 3/2004 | Patana | 375/244 |
| 6,784,751 B2 | * | 8/2004 | Salmi et al. | 331/16 |
| 2002/0121938 A1 | * | 9/2002 | Fan | 331/16 |

OTHER PUBLICATIONS

Cranickx, et al, A 1.75–GHz/3–V Dual–Modulus Divide–by–128/129 Prescaler in 0.7–$\mu$m CMOS, IEEE Journal of Solid–State Circuits, vol. 31, No. 7, Jul. 1996.

* cited by examiner

Primary Examiner—Tesfaldet Bocure
(74) Attorney, Agent, or Firm—Van Pelt, Yi & James LLP

(57) ABSTRACT

A frequency synthesizer and a method for frequency synthesis are disclosed. The frequency synthesizer comprises a voltage controlled oscillator for generating an output signal having a synthesized frequency, and a prescaler connected to the VCO for receiving the output signal and providing a feedback signal. The prescaler programmatically selects between an integer divider value and a fractional divider value to divide the synthesized frequency of the output signal.

16 Claims, 5 Drawing Sheets

FREQUENCY SYNTHESIZER WITH PRESCALER

FIELD OF THE INVENTION

The present invention relates generally to frequency synthesizers. More specifically, a frequency synthesizer that uses a prescaler is disclosed.

BACKGROUND OF THE INVENTION

Frequency synthesizers are widely used in communications systems to generate signals with desired operating frequencies. FIG. 1 is a block diagram of a frequency synthesizer embodiment. An input signal with a stable frequency is sent to a programmable reference frequency divider 105 to produce a reference frequency, fref. The reference frequency is sent to a phase frequency detector (PFD) 115.

The synthesizer output is generated by a voltage controlled oscillator (VCO) 140 that oscillates at a desired frequency. The VCO's output, fout, is controlled by a phase locked loop in which a dual modulus prescaler 130 provides a feedback signal, fb, based on the VCO output. PFD 115 compares fb and fref, and adjusts its output according to the difference. The output of the PFD is sent to charge pump 120 for generating a control voltage. The control voltage is filtered by loop filter 125, and then sent to VCO 140 for generating a desired output, fout. The frequency of fout can be changed by varying the frequency of fref or the frequency of fb. Thus, the frequency synthesizer is able to generate different channel frequencies needed by the system.

Dual modulus prescaler 130 includes P and S counters 135 and divider 145. The divider modulus is selected from two integer constants, usually denoted as N and N+1. The output of the VCO, fout, is divided by the selected modulus to generate a clock signal. S and P counters 135 use the clock to count up to a fixed value S' and a fixed value P', respectively. The counters control the selection of N and N+1, determine the frequency of fb, and indirectly determine the frequency of fout.

Typically, P' defines the frequency band of the output and S' defines the channels within the bands. It is sometimes useful to decrease the minimum S' so the synthesizer can generate more channels with narrower channel spacing in-between. Sometimes, however, there is a tradeoff between the number of channels generated and the minimum output frequency. As the number of channels increases, so does the minimum output frequency. The resulting minimum output frequency may not meet system requirements. The problem cannot be simply solved by decreasing the reference frequency since a lower reference frequency adversely affects the performance of the synthesizer. It would be useful to have a frequency synthesizer design that would mitigate the tradeoff problem, allowing more channels to be generated and keeping the minimum output frequency low. It would also be desirable if the reference frequency can be increased without reducing the number of channels that can be generated.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION

It should be appreciated that the present invention can be implemented in numerous ways, including as a process, an apparatus, a system, or a computer readable medium such as a computer readable storage medium or a computer network wherein program instructions are sent over optical or electronic communication links. It should be noted that the order of the steps of disclosed processes may be altered within the scope of the invention.

A detailed description of one or more preferred embodiments of the invention is provided below along with accompanying figures that illustrate by way of example the principles of the invention. While the invention is described in connection with such embodiments, it should be understood that the invention is not limited to any embodiment. On the contrary, the scope of the invention is limited only by the appended claims and the invention encompasses numerous alternatives, modifications and equivalents. For the purpose of example, numerous specific details are set forth in the following description in order to provide a thorough understanding of the present invention. The present invention may be practiced according to the claims without some or all of these specific details. For the purpose of clarity, technical material that is known in the technical fields related to the invention has not been described in detail so that the present invention is not unnecessarily obscured.

An improved frequency synthesizer is disclosed. The frequency synthesizer employs a prescaler that programmatically selects between an integer divider value and a fractional divider value to divide the synthesized frequency of the output, to provide a feedback signal to the frequency synthesizer. In some embodiments, the prescaler corrects an error introduced by the fractional divider value. In one embodiment, the prescaler corrects the error by using an additional divider whose divider value is programmatically selected based on the frequency synthesizer state. The resulting frequency synthesizer can be used in a variety of communications devices, including wireless communications devices.

Figure 1:
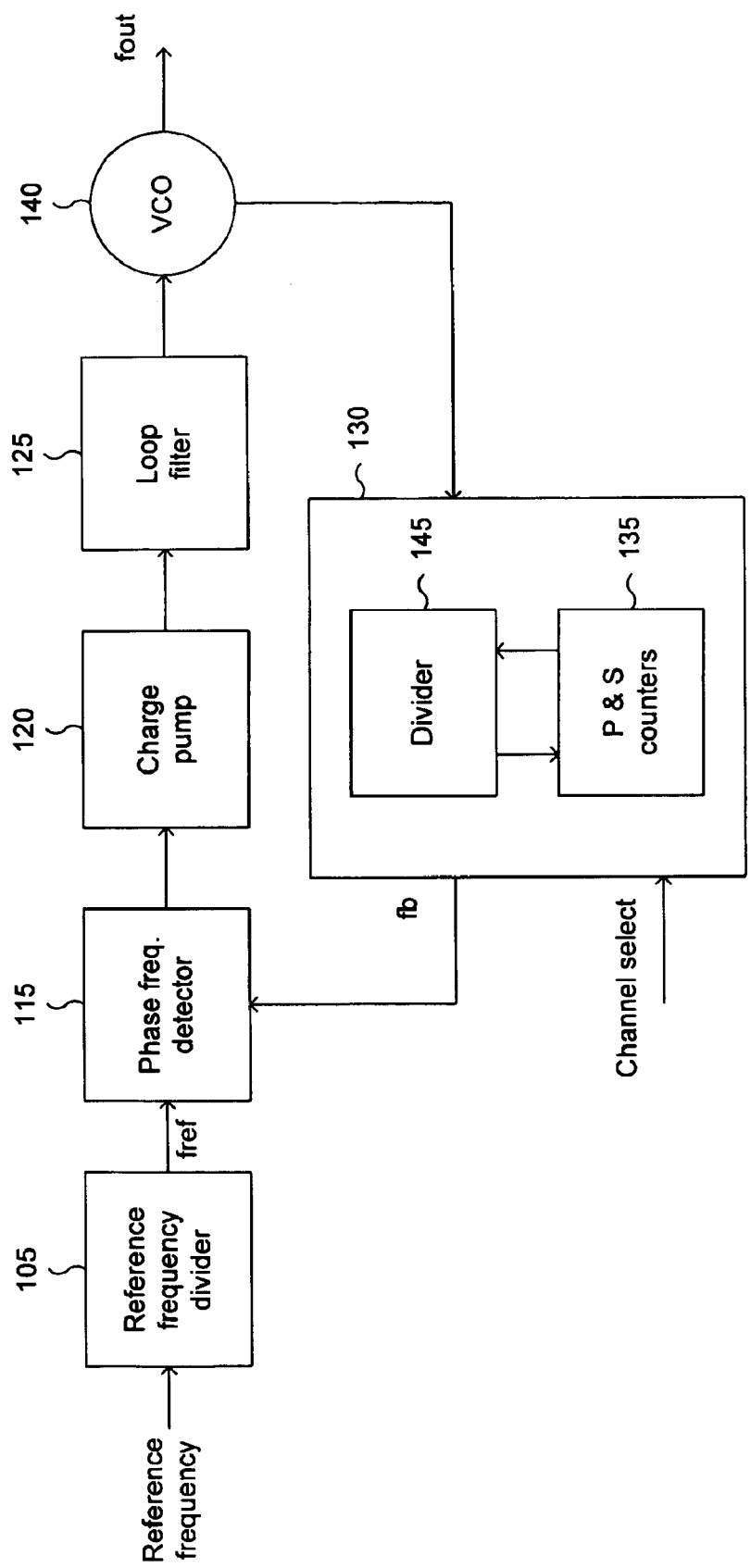
FIG. 1 is a block diagram of a frequency synthesizer embodiment.

Details of the prescaler are examined to better understand the present invention. Returning to FIG. 1, the clock signal generated by divider 145 is used by S and P counters 135 for counting. The S counter counts up to a fixed value S' and the P counter counts up to a fixed value P'. Both S' and P' are programmable before a counting cycle starts. S', P', and a divider value N are used to determine the output frequency fout. While the S counter value is less than S', the divider divides fout by N+1. While the S counter value is greater than or equal to S' and the P counter value is less than P', the divider divides fout by N. When the P counter value reaches P', the feedback signal fb is generated, both counters are reset, and the process begins again. For this arrangement to work properly, P' should be greater than S'.

The relationship between the VCO output frequency, fout, and the reference frequency, fref, is expressed by the following expression:

$$f_{out} = f_{ref} \cdot [(N+1) \cdot S' + N \cdot (P' - S')] \quad \text{(Equation 1)}$$
$$= f_{ref} \cdot N \cdot (P' + S')$$

where P'>S'.

The range of output frequencies that corresponds to a P' value is sometimes referred to as a frequency band. For a given P' value, the range of possible S' values determine how many frequency channels are attainable in the output frequency band. S' values ranging from 0 to Smax correspond to a total of Smax+1 output frequency channels. A different P' value results in a new group of Smax+1 different output frequency channels. A convenient choice for the minimum value of P' is Smax+1, since it always satisfies the P'>S' condition in Equation 1. This P' value leads to a minimum output frequency defined by the following equation:

$$f_{min} = f_{ref} \cdot N \cdot P_{min} \quad \text{(Equation 2)}$$
$$= f_{ref} \cdot N \cdot (S_{max} + 1)$$

Figure 2A:
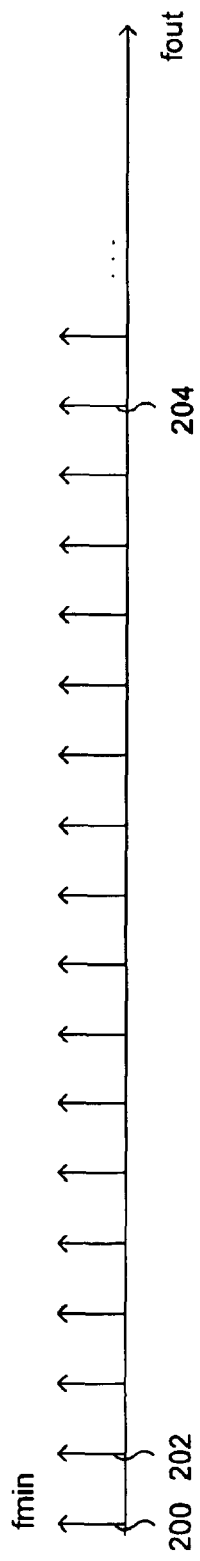
FIGS. 2A–2B are frequency diagrams illustrating the output frequency bands and channels for frequency synthesizers with different prescaler implementations.
Figure 2B:
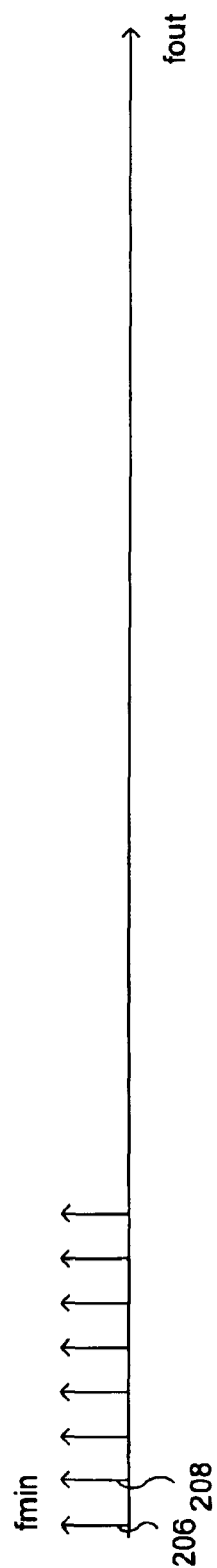

FIGS. 2A–2B are frequency diagrams illustrating the output frequency bands and channels for frequency synthesizers with different prescaler implementations. FIG. 2A is a frequency diagram illustrating the output frequency bands and channels for the frequency synthesizer described in FIG. 1. Prescalers with N=16, Smax=15 and Pmin=16 are discussed in this specification for the purposes of example, unless otherwise stated. It should be noted that other values may be used for different prescaler implementations. According to Equation 2, the corresponding fmin is 256 times fref, shown in FIG. 2A as a signal labeled 200. The next available output frequency (shown as a signal labeled 202) occurs when S' is incremented from 0 to 1, at 257 times fref. Thus, the prescaler can be tuned to generate frequencies spaced apart by fref. The frequency band for P'=Pmin= Smax+1 has 16 frequency channels, ranging from 256 to 271 times fref. The next frequency band starts at P'=Smax+2, with a corresponding fout of 272 times fref, shown as signal 204.

In some embodiments, the prescaler selects between an integer value divider and a fractional value divider to increase the number of channel frequencies that can be synthesized. Generally, the integer value is expressed as N and the fractional value is expressed as N+1/n, where n is an integer greater than 1. The prescaler's selection is based on the first counter output and the second counter output. The number of times the prescaler selects the integer divider determines the frequency band and the number of times the prescaler selects the fractional divider determines the frequency channels within the frequency band. In one embodiment, the integer value is N and the fractional value is N+½. The operation of the prescaler is similar to the one shown in FIG. 1: when S is less than S', the prescaler divides the VCO output by N+½; when S is greater than or equal to S', the prescaler divides the output by N. The relationship between fout and fref is expressed by the following equation:

$$f_{out} = f_{ref} \cdot [(N+1/2) \cdot S' + N \cdot (P' - S')] \quad \text{(Equation 3)}$$
$$= f_{ref} \cdot [N \cdot P' + S'/2]$$

where P'>S'.

The VCO output frequency corresponds to a frequency channel within a frequency band. According to Equation 3, the frequency band is determined by the number of times the integer divider value is selected and a frequency channel within the frequency band is determined by the number of times the fractional divider value is selected. FIG. 2B is a frequency diagram illustrating the output frequency bands and channels for a frequency synthesizer embodiment according to the present invention. For the minimum P'=Smax+1, the corresponding fmin is still 256 times fref, shown as the signal labeled 206. The next available output (208) occurs at 256.5 times fref. Thus, the spacing between channels is half of fref and can be programmed to twice as many channels as before. Alternatively, for the same channel spacing, the reference frequency can be doubled, thereby doubling the synthesizer loop gain and bandwidth.

This approach has a drawback compared to the standard approach. For a given fref and N, Smax needs to be increased in order to maintain the bandwidth defined by the span of possible S counter values. For example, to maintain a bandwidth of 256 fref to 271 fref for N=16, a Smax of 15 is no longer sufficient. Instead, Smax of 31 is needed according to Equation 3. As a result, Pmin becomes 32, and fmin is 512 times fref. The resulting higher fmin may not meet the requirements of some systems.

In some embodiments, the prescaler includes an additional mode that permits the doubling of Smax while maintaining the value of Pmin. An additional variable S" that equals S' subtracted by a constant is introduced. The value of S" is determined empirically, and varies in different embodiments. In one embodiment, Smax is equal to 31 and S" is equal to S'-16. When S' is less than 16, the prescaler divides its input by N+½ while S is less than S', and divides its input by N while S is greater than or equal to S'. While S' is greater than or equal to 16, the prescaler operates according to the following equation:

$$f_{out} = f_{ref} \cdot [(N+1/2) \cdot S'' + N \cdot (P' - S'')] \quad \text{(Equation 4)}$$
$$= f_{ref} \cdot [(N+1/2) \cdot (S' - 16) + N \cdot (P' - S' + 16)]$$
$$= f_{ref} \cdot [N \cdot P' + S'/2 - 8]$$

where P'>S".

Compare Equation 4 with Equation 3, there is an error of 8 cycles in the output signal. The number of cycles in the error may vary for other embodiments, but should be a constant value. To correct this constant error, the clock period of the prescaler's clock is adjusted. In this embodiment, the period of the last clock pulse is extended by the same number of cycles as the error. The extended clock pulse keeps the counter from counting further once the desired number of cycle has been reached. An output with the desired frequency is thus produced. In some embodiments, the clock pulse is shortened to correct the error.

Figure 3:
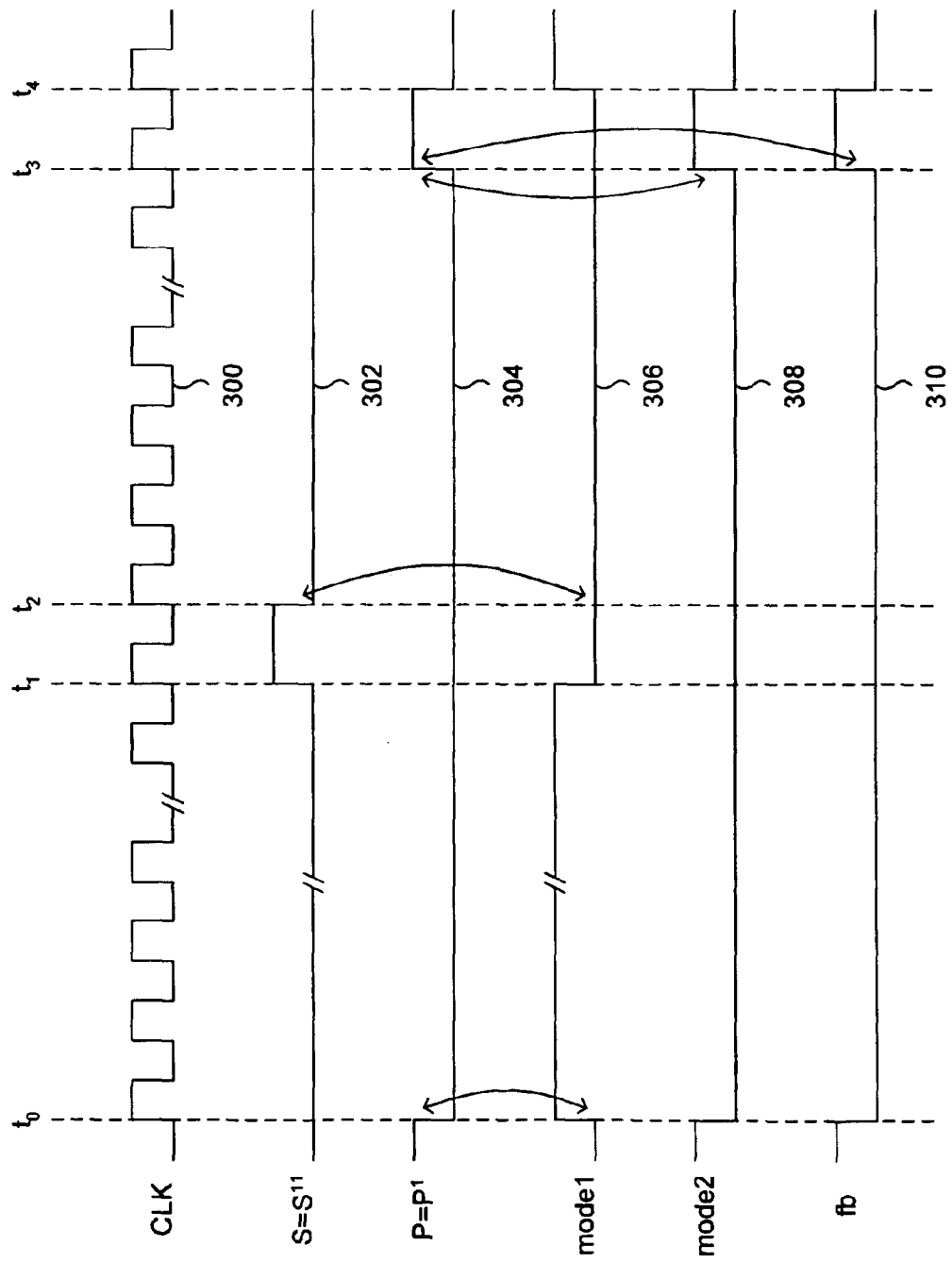
FIG. 3 shows timing diagrams for a prescaler embodiment according to the present invention.

FIG. 3 shows timing diagrams for a prescaler embodiment according to the present invention. Signal 300 is the clock signal of the prescaler; signals 302 and 304 show the timing for S and P counters, respectively; signals 306 and 308 correspond to mode signals mode1 and mode2; and signal 310 corresponds to the feedback signal generated, fb.

Consider the case where S' equals 24. S" equals 24–16, which is 8. The beginning of a cycle occurs at time t0. The S counter reaches S" at time t1; in other words, the S counter has counted 8 clock cycles (not all the clock cycles are shown). Between t0 and t1, mode1 asserts, and the prescaler divides its input frequency by N+1. At the beginning of the last of the 8 clock cycles, t1, the S counter is triggered and stays on for one clock cycle. Starting at t1, the prescaler divides its input frequency by N, and therefore the clock period is slightly longer. At time t3, P counter reaches 16 clock cycles and mode2 asserts. The assertion of mode2 causes the period of the last clock cycle to be extended by 8 cycles of the input frequency. At time t4, the counters reset and the cycle repeats.

Figure 4:
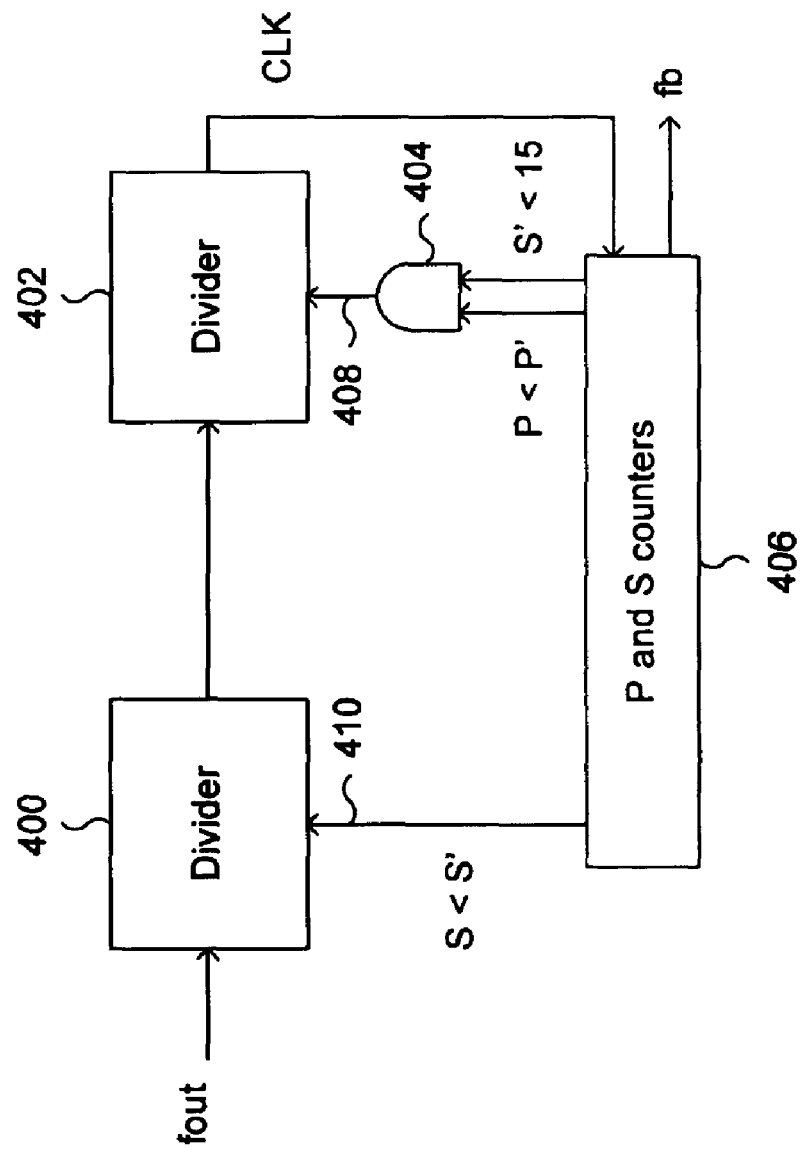
FIG. 4 is a block diagram illustrating a prescaler embodiment according to the present invention.

FIG. 4 is a block diagram illustrating a prescaler embodiment according to the present invention. The input to the prescaler is the output of the VCO, fout. The input is sent to dividers 400, which is cascaded with another divider 402. Control signal mode1 is determined by the counter values, and then sent to divider 400 via interface 410. The counter values are operated on by a logic operator 404 to generate another control signal, mode2, that is sent to divider 402 via interface 408. The output of divider 402 is the clock signal for P and S counters 406. The output of the prescaler, fb, is generated based on the clock signal and the states of the counters.

If mode1 is asserted, divider 400 divides the output frequency of the VCO, fout, by 8.5; otherwise, the divider divides the output frequency by 8. Divider 402 divides the output of divider 400 by 2 when mode2 is not asserted. When S' is greater than 15 and when P reaches P', mode2 is asserted, divider 402 divides the output of divider 400 by 3, and the last pulse of the clock is extended by 8 cycles according to the clock of the input.

Figure 5:
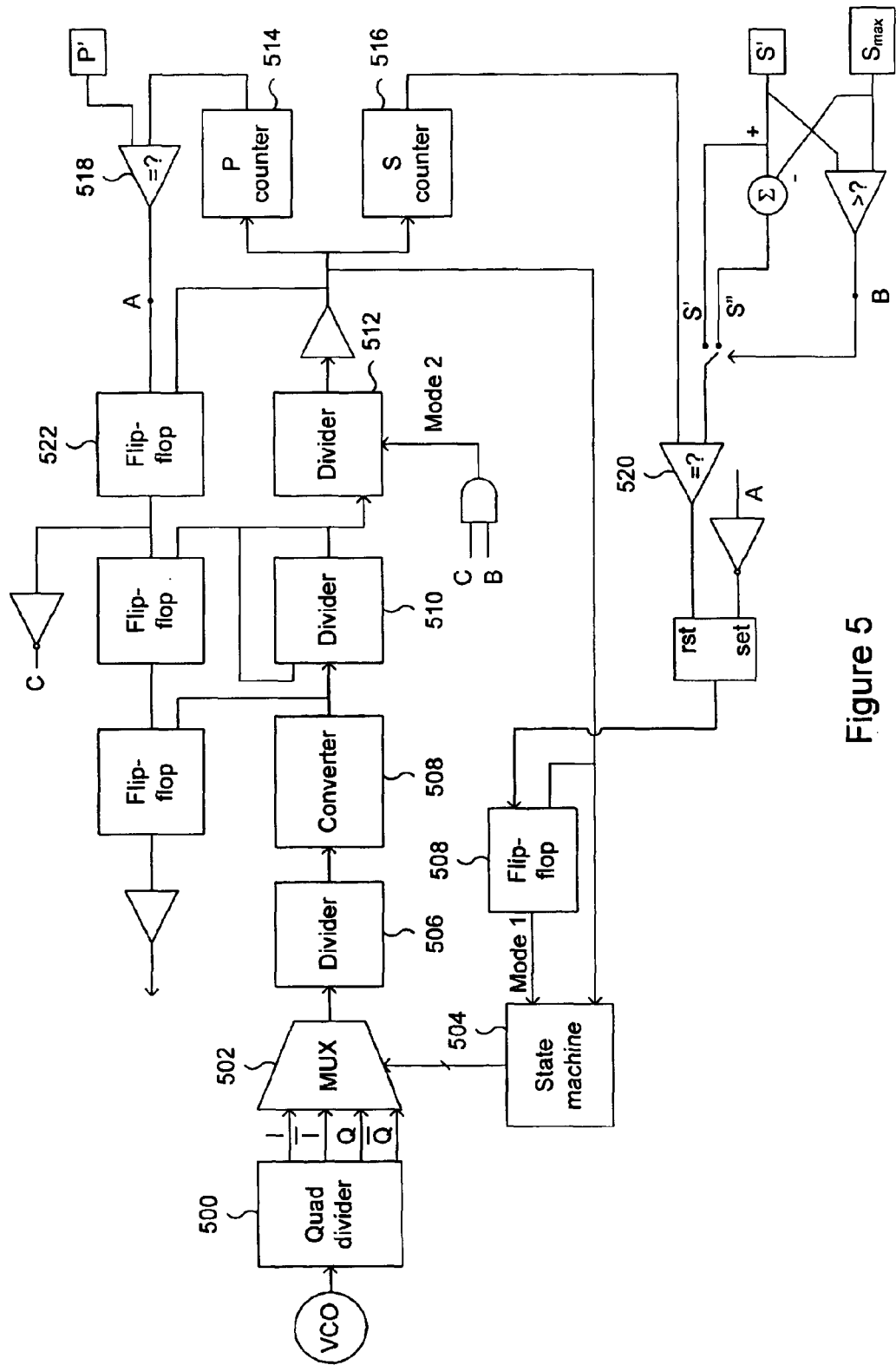
FIG. 5 is a circuit diagram illustrating details of the prescaler shown in FIG. 4.

FIG. 5 is a circuit diagram illustrating details of the prescaler shown in FIG. 4. The VCO output is divided by a quadrature divider 500 into four quadrature signals I,Ī,Q and Q̄. Multiplexer 502 selects one of the four signals and sends it to divider 506. In this embodiment, divider 506 is a low-swing differential divider that divides its input by 2. A state machine 504 determines how the multiplexer selects its input. The state machine is controlled by the mode1 signal. The clocking of the state machine is determined by the clock signal generated by divider 512. When mode1 signal is high, the state machine causes the multiplexer to rotate its selection continuously through the sequence of four signals I,Ī,Q and Q̄. The resulting output is a phase-shifted version of the original input, which is then divided by divider 506. At this point, the output frequency of divider 506 is the VCO frequency divided by 4.5. When mode1 signal is low, the state machine causes the multiplexer to cease rotating its selection. A single input is selected, and the output of divider 506 at this point is the original input divided by 4.

The output of divider 506 is sent to a logic level converter 508 that converts the low swing differential logic signal to a CMOS logic signal. The output of the logic level converter is divided by divider 510, generating a signal that is the original input divided by 8 or 8.5, depending on the state of the state machine. The resulting signal is sent to divider 512. The divider is controlled by the mode2 signal. Most of the time, mode2 is low and the divider divides its input by 2. However, when S' is greater than 15 and P counter reaches P', mode2 signal is asserted and the divider divides its input by 3. The period of the last clock pulse is extended by 8 cycles of the VCO, before the clock becomes high again, correcting the error introduced by the fractional divider value. Thus, the error in the clock generated is corrected and the synthesizer can be programmed to generate desired frequencies without increasing the size of the P and S counters or reducing the reference frequency. The clock signal generated by divider 512 is used to drive P counter 514, S counter 516 and state machine 504.

Comparator 518 compares the output of the P counter with P'. Comparator 520 compares the output of the S counter with either S' or S'', according to a signal B that indicates whether S is greater than Smax. The results of the two comparators are combined to generate the mode1 signal. The output of comparator 518 is latched by flip-flop 522, which is inverted to form an output signal C. Signals C and B are combined to form the mode2 signal.

The frequency synthesizer design according to the present invention can be used in a variety of applications, including transceivers of wireless devices. In one embodiment, the frequency synthesizer is used in a transceiver device of a wireless networking card. In some embodiments, the frequency synthesizer is used in transceiver devices supporting the IEEE 802.11a and 802.11b protocols. Appropriate reference frequency and divider values can be computed for these protocols.

An improved frequency synthesizer has been disclosed. The frequency synthesizer employs a prescaler that programmatically selects between an integer divider value and a fractional divider value to divide the synthesized frequency of the output, to provide a feedback signal to the frequency synthesizer. Errors introduced by the fractional divider value are corrected by the prescaler. Using a fractional divider value allows more channels to be generated and still keeps the minimum output frequency within desired ranges. Alternately, the reference frequency can be increased without reducing the number of channels that can be generated. The improved frequency synthesizer can be used in a variety of communications devices, including wireless communications devices.

Although the foregoing invention has been described in some detail for purposes of clarity of understanding, it will be apparent that certain changes and modifications may be practiced within the scope of the appended claims. It should be noted that there are many alternative ways of implementing both the process and apparatus of the present invention. Accordingly, the present embodiments are to be considered as illustrative and not restrictive, and the invention is not to be limited to the details given herein, but may be modified within the scope and equivalents of the appended claims.

What is claimed is:

1. A frequency synthesizer comprising:
   a voltage controlled oscillator for generating an output signal having a synthesized frequency; and
   a prescaler connected to the VCO for receiving the output signal and providing a feedback signal; wherein:
   the prescaler programmatically selects between an integer divider value and a fractional divider value to divide the synthesized frequency of the output signal; and
   the integer divider value is a first integer divider value; and the prescaler corrects an error introduced by the fractional divider by programmatically selecting between a second integer divider value and a third integer divider value.

2. A frequency synthesizer comprising:
   a voltage controlled oscillator for generating an output signal having a synthesized frequency; and
   a prescaler connected to the VCO for receiving the output signal and providing a feedback signal; wherein:
   the prescaler programmatically selects between an integer divider value and a fractional divider value to divide the synthesized frequency of the output signal; and
   the prescaler includes a first counter having a first counter output and a second counter having a second counter output.

3. A frequency synthesizer as recited in claim 2 wherein the prescaler corrects an error introduced by the fractional divider.

4. A frequency synthesizer as recited in claim 1 wherein the prescaler corrects an error introduced by the fractional divider by adjusting an output clock period.

5. A frequency synthesizer as recited in claim 2 wherein the prescaler corrects an error introduced by the fractional divider by extending an output clock period.

6. A frequency synthesizer as recited in claim 2 wherein the prescaler divides the synthesized frequency to produce a clock signal.

7. A frequency synthesizer as recited in claim 2 wherein the prescaler divides the synthesized frequency to produce a clock signal; and the prescaler corrects an error introduced by the fractional divider value by extending a period of the clock signal.

8. A frequency synthesizer as recited in claim 2 wherein the frequency synthesizer is included in a wireless transceiver device supporting IEEE 802.11a protocol.

9. A frequency synthesizer as recited in claim 2 wherein the frequency synthesizer is included in a wireless transceiver device supporting IEEE 802.11b protocol.

10. A frequency synthesizer comprising:

a voltage controlled oscillator for generating an output signal having a synthesized frequency; and a prescaler connected to the VCO for receiving the output signal and providing a feedback signal; wherein:

the prescaler programmatically selects between an integer divider value and a fractional divider value to divide the synthesized frequency of the output signal; and the prescaler includes a first counter having a first counter output and a second counter having a second counter output; and the prescaler programmatically selects between the integer divider value and the fractional divider value based on the first counter output and the second counter output.

11. A frequency synthesizer comprising:

a voltage controlled oscillator for generating an output signal having a synthesized frequency; and a prescaler connected to the VCO for receiving the output signal and providing a feedback signal; wherein:

the prescaler programmatically selects between an integer divider value and a fractional divider value to divide the synthesized frequency of the output signal; and the prescaler includes a first counter having a first counter output and a second counter having a second counter output; and the prescaler corrects an error introduced by the fractional divider using the first counter output and the second counter output.

12. A frequency synthesizer comprising:

a voltage controlled oscillator for generating an output signal having a synthesized frequency; and a prescaler connected to the VCO for receiving the output signal and providing a feedback signal; wherein:

the prescaler programmatically selects between an integer divider value and a fractional divider value to divide the synthesized frequency of the output signal;

the output frequency corresponds to a frequency channel within a frequency band;

the frequency band is determined by number of times the integer divider value is selected; and the frequency channel is determined by number of times the fractional divider value is selected.

13. A prescaler comprising:

an input interface for receiving an input signal with a frequency;

a first divider configured to divide the input signal;

a first counter having a first counter output; and a second counter having a second counter output;

wherein:

the first divider programmatically selects between an integer divider value and a fractional divider value to divide the input signal.

14. A prescaler as recited in claim 13 wherein the prescaler is used for generating a feedback signal in a frequency synthesizer.

15. A prescaler comprising:

an input interface for receiving an input signal with a frequency;

a first divider configured to divide the input signal; and a second divider; wherein:

the first divider programmatically selects between an integer divider value and a fractional divider value to divide the input signal;

the first divider outputs a clock signal; and the second divider is configured to correct the clock signal.

16. A method for synthesizing an output signal having a synthesized frequency including:

receiving a voltage controlled oscillator output having a frequency;

dividing the frequency of the voltage controlled oscillator output by programmatically selecting between an integer divider value and a fractional divider value; and producing a feedback signal for controlling frequency of the output signal; wherein programmatically selecting is based on a first counter output and a second counter output.

* * * * *

UNITED STATES PATENT AND TRADEMARK OFFICE
CERTIFICATE OF CORRECTION

PATENT NO.         : 6,928,127 B2                                      Page 1 of 1
APPLICATION NO. : 10/387231
DATED                  : August 9, 2005
INVENTOR(S)        : Mack et al.

It is certified that error appears in the above-identified patent and that said Letters Patent is hereby corrected as shown below:

Claim 4
Column 6, line 55 delete "claim 1" and insert -- claim 2 --

Signed and Sealed this

Twenty-second Day of June, 2010

David J. Kappos
*Director of the United States Patent and Trademark Office*